(12) United States Patent
Wang et al.

(10) Patent No.: US 12,084,388 B2
(45) Date of Patent: Sep. 10, 2024

(54) METHOD FOR PREPARING CARBIDE PROTECTIVE LAYER

(71) Applicant: NATIONAL CHUNG SHAN INSTITUTE OF SCIENCE AND TECHNOLOGY, Taoyuan (TW)

(72) Inventors: Chih-Hsing Wang, Taoyuan (TW); Cheng-Jung Ko, Taoyuan (TW); Chuen-Ming Gee, Taoyuan (TW); Chih-Wei Kuo, Taoyuan (TW); Hsueh-I Chen, Taoyuan (TW); Jun-Bin Huang, Taoyuan (TW); Ying-Tsung Chao, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 84 days.

(21) Appl. No.: 18/096,568

(22) Filed: Jan. 13, 2023

(65) Prior Publication Data
US 2024/0239712 A1    Jul. 18, 2024

(51) Int. Cl.
C04B 35/56 (2006.01)
C01B 32/21 (2017.01)
C04B 35/626 (2006.01)
C04B 35/634 (2006.01)
C04B 35/64 (2006.01)
C04B 35/645 (2006.01)
(Continued)

(52) U.S. Cl.
CPC .......... *C04B 35/5607* (2013.01); *C01B 32/21* (2017.08); *C04B 35/6264* (2013.01); *C04B 35/63416* (2013.01); *C04B 35/6342* (2013.01); *C04B 35/63424* (2013.01); *C04B 35/63444* (2013.01); *C04B 35/645* (2013.01); *C04B 2235/3839* (2013.01); *C04B 2235/6562* (2013.01); *C04B 2235/6567* (2013.01); *C04B 2235/661* (2013.01); *C30B 23/00* (2013.01); *C30B 35/002* (2013.01)

(58) Field of Classification Search
None
See application file for complete search history.

(56) References Cited

U.S. PATENT DOCUMENTS 9,315,921 B2    4/2016   Nakamura et al.
2010/0239885 A1*  9/2010  Nakamura .............. C04B 41/87
                                                   427/376.6

FOREIGN PATENT DOCUMENTS

CN    1942415 A    4/2007

* cited by examiner

*Primary Examiner* — Alexander M Weddle

(57) ABSTRACT

A method for preparing a carbide protective layer comprises: (A) mixing a carbide powder, an organic binder, an organic solvent and a sintering aid to form a slurry; (B) spraying the slurry on a surface of a graphite component to form a composite component; (C) subjecting the composite component to a cold isostatic pressing densification process; (D) subjecting the composite component to a constant temperature heat treatment; (E) repeating steps (B)-(D) until a coating is formed on a surface of the composite component; (F) subjecting the coating to a segmented sintering process; (G) obtaining a carbide protective layer used for the surface of the composite component. Accordingly, while the carbide protective layer can be completed by using the wet cold isostatic pressing densification process and the cyclic multiple superimposition method, so that it can improve the corrosion resistance in the silicon carbide crystal growth process environment.

9 Claims, 3 Drawing Sheets

(51) Int. Cl.
*C30B 23/00* (2006.01)
*C30B 35/00* (2006.01)

METHOD FOR PREPARING CARBIDE PROTECTIVE LAYER

BACKGROUND OF THE INVENTION

1. Field of the Invention

The present disclosure relates to a method for preparing a carbide protective layer, and in particular to a method for preparing a carbide protective layer by low temperature sintering.

2. Description of the Related Art

A high temperature corrosion resistance carbide protective layer is used in silicon carbide physical vapor transport (PVT) crystal growth environment, a specific binary transition metal element carbide coating (such as tantalum carbide, hafnium carbide) has high melting point, corrosion resistance and other physical properties, can be applied to here as a protective layer, but now the coating preparation technology has many limitations: such as the limitation of substrate appearance, environmental pollution of by-products, high apparatus cost.

Binary carbide materials for preparing carbide refractory protective layer are IIIB-VB transition metal elements (such as: tantalum carbide, hafnium carbide and other carbide coating materials), because of their own high melting point properties of refractory materials, it is required for researchers to carry out the application technology through high temperature heat treatment apparatus. In addition, if the common chemical vapor deposition (CVD) preparation technology in the market is used, there is a limitation of the geometric appearance of the substrate to be plated, and the thickness of the prepared coating is also limited to <30 μm (±15 μm).

Patent CN1942415A uses $TaCl_5$, $TaF_5$ and other tantalum halides and $CH_4$, $C_3H_8$, $H_2$, Ar and other mixed gases to carry out thermal decomposition in a reactor and deposit on a carbon substrate to obtain a coating. CVD apparatus is used for reaction, the reaction process will inevitably generate by-products such as HCl strong acid, which has problems of certain environmental pollution and recycling processing; although the process can provide a stable and dense coating, it is limited by the coating thickness specification of less than 50 μm, which is easy to lead to cracking defects in the deposited stacked structure, and there is a risk of serious open intergranular fracture.

Patent U.S. Pat. No. 9,315,921B2 uses TaC powder mixed with polymer to form a binder slurry, which is covered on a graphite component to be plated by spraying technology, and then subjected to high temperature heat treatment (preferably temperature >2500° C.) to make a green body sintered into a densified coating. This preparation technology can overcome the limitation of substrate appearance, and there is no severe or dangerous by-product formation in the process reaction; and the coating thickness specification can reach 50 μm or more, in order to improve the corrosion resistance and service life of the protective layer; the crystal of the coating structure is randomly arranged and isotropic, which overcomes the risk of serious open intergranular fracture caused by the regular arrangement in CVD coating, but the above effect can only be achieved by high temperature heat treatment (preferably temperature >2500° C.).

In addition, the slurry formulation in the present technical field contains several highly toxic organic compounds, which has a certain operational hazard risk, and the high temperature cracking reaction may also release toxic by-products; and the coating forming has a certain energy requirement of high temperature apparatus, the preferable temperature of preparation >2500° C. Therefore, the cost of implementing the overall process is high, resulting in the lack of research output so far.

In summary, the present disclosure uses the slurry spraying method and low temperature sintering conditions to complete the carbide protective layer, so as to reduce the production cost, environmental pollution, and avoid the limitation of substrate appearance; at the same time, the carbide protective layer can be completed by using the wet cold isostatic pressing densification process and the cyclic multiple superimposition method, so that it can improve the corrosion resistance in the silicon carbide crystal growth process environment.

BRIEF SUMMARY OF THE INVENTION

In view of the above shortcomings of the prior art, a comparative example of the present disclosure uses a powder sintering method without pressing to prepare a carbide coating, wherein a material of the carbide coating is a binary carbide of IIIB-VB transition metal elements, and a protective layer with corrosion resistance is completed by superimposing multiple coatings. In one embodiment, the nanoscale carbide powder and the polymer binder are mixed into a slurry, and then the slurry is covered on a graphite component through spraying technology, and after heat treatment with a temperature of 50-200° C., a segmented sintering process is carried out to heat to 1800-2300° C. to obtain a coating with a densified structure. An embodiment of the present disclosure is to complete a carbide protective layer under a low temperature condition (less than 2500° C.), using a wet cold isostatic pressing densification technology to press the surface of the coating material to 1000-20000 psi, and then the above preparation processes are repeated by cyclic multiple times to superimpose and complete the carbide protective layer, and the carbide protective layer has the ability to resist corrosion in a physical vapor deposition (PVT) process environment of silicon carbide.

The present disclosure provides a method for preparing a carbide protective layer, steps comprising: (A) mixing a carbide powder, an organic binder, an organic solvent and a sintering aid to form a slurry; (B) spraying the slurry on a surface of a graphite component to form a composite component; (C) subjecting the composite component to a cold isostatic pressing densification process; (D) subjecting the composite component to a constant temperature heat treatment; (E) repeating steps (B)-(D) until a coating is formed on the surface of the composite component, and the coating has an effective protective thickness; (F) subjecting the coating to a segmented sintering process; (G) obtaining a carbide protective layer used for the surface of the composite component.

In one embodiment, the carbide powder is selected from a binary carbide of IIIB-VB transition metal elements.

In one embodiment, the organic binder is polymethyl methacrylate (PMMA), polyvinyl alcohol (PVA), polyvinyl butyral (PVB) or polyvinylpyrrolidone (PVP).

In one embodiment, the organic solvent is selected from ethanol, isopropanol, acetone, butanone, formic acid, acetic acid, toluene or N-methylpyrrolidone.

In one embodiment, the sintering aid is selected from titanium, silicon, chromium, nickel, silicon nitride, yttrium oxide or ytterbium oxide.

In one embodiment, an applying pressure of the cold isostatic pressing densification process is 1000-20000 psi, time of the applying pressure is 1 hour or more.

In one embodiment, a temperature of the constant temperature heat treatment is 50-200° C.

In one embodiment, the effective protective thickness is 100 μm or more.

In one embodiment, the segmented sintering process is divided into: a previous stage of sintering, heat-treated at 250-500° C., a heating rate is 0.2-1° C./min, and a holding time is 1-3 hours; a post-stage sintering, sintered and densified at 1800-2300° C., a heating rate is 1-5° C./min, and a holding time is 0.5-5 hours.

The above summary and the following detailed description and accompanying drawings are intended to further illustrate the manner, means and effect of the present disclosure for achieving a predetermined object. Other objects and advantages of the present disclosure will be described in subsequent descriptions and drawings.

DETAILED DESCRIPTION OF THE INVENTION

The implementation of the present disclosure is described by the specific embodiments as below, those skilled in the art can easily understand the advantage and effect by the content disclosed by the present specification.

Figure 1:
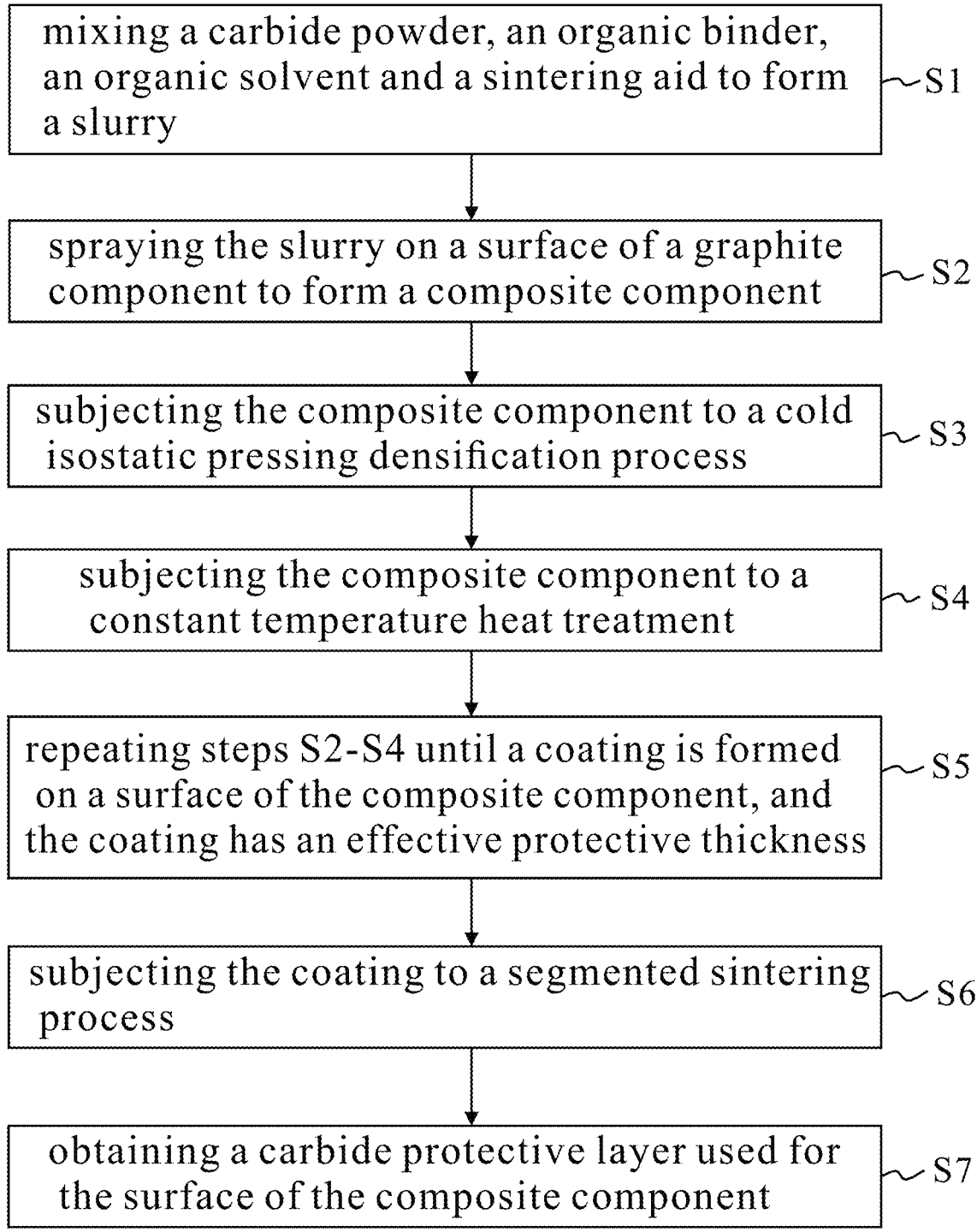
FIG. 1 is a flow chart of a method for preparing a carbide protective layer of the present disclosure.

The present disclosure provides a method for preparing a carbide protective layer, which can effectively reduce the cost of production. In the method, a carbide protective layer is prepared on a surface of a graphite component, and the graphite component and the carbide protective layer form a composite component. The preparation of a carbide protective layer in an embodiment of the present disclosure undergoes a process of a green body construction to a high-temperature densification. Next, referring to FIG. 1, FIG. 1 is a flow chart of a method for preparing a carbide protective layer of the present disclosure. As shown in FIG. 1, a coating slurry for constructing the green body is made by uniformly mixing a carbide powder, an organic binder, an organic solvent and a sintering aid (step S1), and continuously the slurry is sprayed on a surface of the graphite component to complete a composite component of the transition stage (step S2). In order to improve the sintering densification ability of the green body on a surface of the composite component, the surface is subjected to a cold isostatic pressing densification process (step S3), and then a heat treatment process is performed at a certain range of temperatures (step S4). After the composite component is cooled back to room temperature, the green body construction step is repeated on the surface of the composite component several times until the green body coating (hereinafter referred to as the coating) on the surface of the composite component reaches an effective protective thickness (step S5). The segmented sintering process is then used to heat to 1800-2300° C. to densify the green body coating on the surface of the composite component (step S6), and then a carbide protective layer with corrosion resistance protection function is obtained on the surface of the composite component (step S7).

Figure 2:
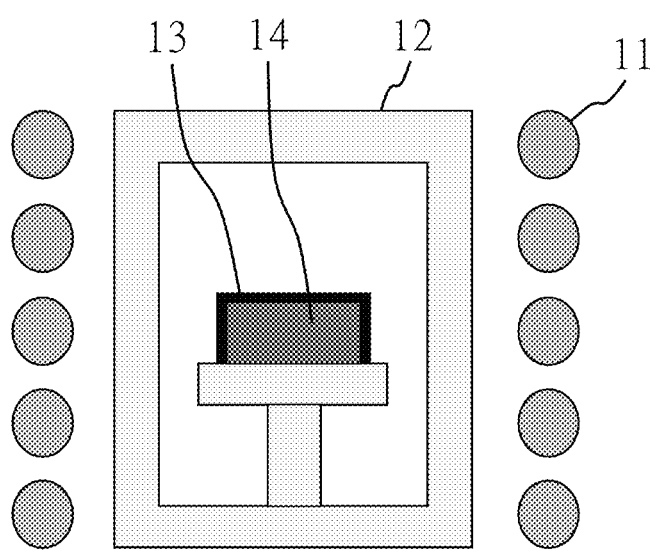
FIG. 2 is a schematic view of TaC coating reaction apparatus of the present disclosure.

Further, referring to FIG. 2, FIG. 2 is a schematic view of TaC coating reaction apparatus of the present disclosure. The TaC coating reaction apparatus is an apparatus used in the segmented sintering process to heat up to 1800-2300° C. of the present disclosure, wherein a heat source 11 and a heating furnace body 12 are combined into an induction heating system, the heat source 11 is an induction heating coil to output a specific alternating magnetic field, so that an induction graphite carrier of the heating furnace body 12 generates eddy current, resulting in self-heating of the heating furnace body. The product to be prepared by the present disclosure is a composite component having a carbide protective layer, such as the TaC coating 13 and the graphite component 14 of FIG. 2, the TaC coating 13 is covered on an outer surface of the graphite component 14, the TaC coating 13 and the graphite component 14 are used as a composite component for the sintering process, and placed in the heating system combined with the heat source 11 and the heating furnace body 12, and the sintering process is carried out at a certain ambient pressure and operating temperature.

The present disclosure compares two embodiments, performing Experiments A and B, wherein Experiment A is a sintering preparation method without pressing, and Experiment B is a sintering preparation method introducing a cold isostatic pressing densification process; the graphite components tested by both are graphite plates with specifications of 50×50×10 mm$^3$, and the unit coating weight of spraying blended slurry on the graphite plates is the same; applying pressure range of the cold isostatic pressing of Experiment B is 1000-20000 psi, the operation time is 1 hour or more, the coated composite components are performed heat treatment, and the segmented sintering process is heated to 1800-2300° C., and the temperature is held for 5 hours or more to obtain the composite components with densified coating.

Both the preparation methods of Experiments A and B use slurry of carbide nano powder mixed with organic binder, in which particle sizes of carbide and sintering aid powder are ≤1 μm, and the carbide is a binary carbide of IIIB-VB transition metal elements such as tantalum carbide, niobium carbide, tungsten carbide, and the sintering aid is titanium, silicon, chromium, nickel, silicon nitride, yttrium oxide, ytterbium oxide and other material substances; the organic binder is polymethyl methacrylate (PMMA), polyvinyl alcohol (PVA), polyvinyl butyral (PVB), polyvinylpyrrolidone (PVP); wherein the solvents added to the organic binder are ethanol, isopropanol, acetone, butanone, formic acid, acetic acid, toluene, N-methylpyrrolidone.

Both the preparation methods of Experiments A and B use slurry spraying technology to cover the surface of the graphite components with the green body coating, and multiple the green body coatings are repeatedly prepared to construct to an appropriate thickness, in which each the green body coating is standing for 1 hour or more, and then heat-treated with a temperature of 50-200° C. and held at a temperature for 1 hour or more, and then continued to the next construction.

Both the preparation methods of Experiments A and B are heated to 1800-2300° C. in a negative pressure environment of argon gas to densify the coating in the high temperature sintering forming stage. The quality analysis of the final prepared coating uses a field emission electron microscope to detect the microstructure characteristics, and crystal structure information of the coating material is obtained through X-ray diffraction instrument.

The forming slurry formula and the parameters of high temperature sintering process in the preparation methods of Experiments A and B are the same, and the composition of the spraying slurry used is mainly 50-70 wt. % of tantalum carbide powder, of which 1-5 wt. % of silicon, silicon nitride, yttrium oxide and other powders are added as a sintering aid, and finally the segmented sintering process is carried out to heat to 1800-2300° C. to densify the coating.

Figure 3:
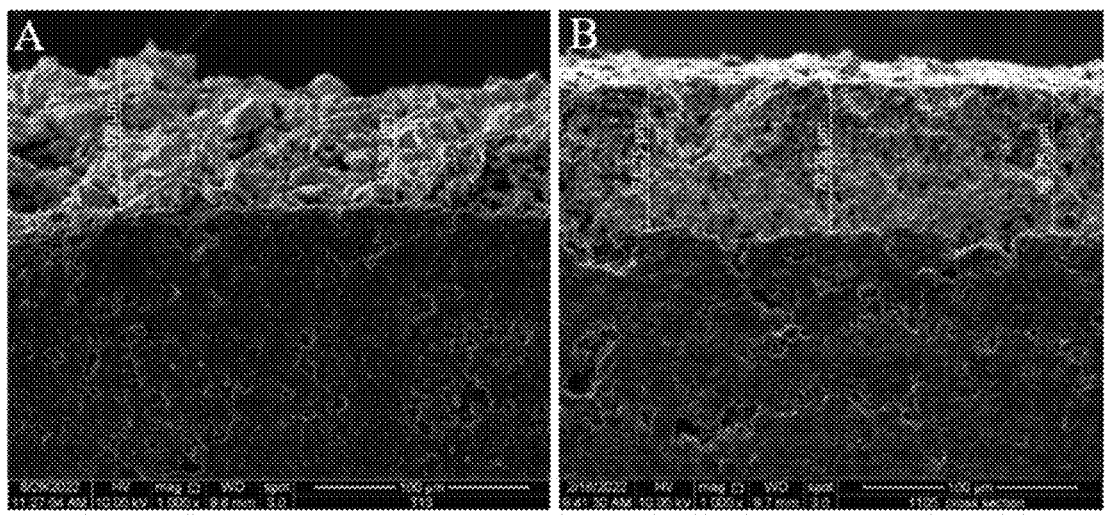
FIG. 3 (A) is a microstructure of a coating section of Experiment A preparation method of the present disclosure; (B) is a microstructure of a coating section of Experimental B preparation method of the present disclosure.

Experiment B adopts multi-layer constructing green body, uniform surface pressure of 18000-20000 psi and holding pressure for 2 hours or more by the operation of a wet cold isostatic pressing machine, followed by a constant temperature heat treatment of 50-200° ° C. and holding temperature for 1 hour or more, after coating densification, the average thickness of the green body decreases by 20-25%, and the density of the green body increases to 45-60%. The microstructure of tantalum carbide coating after sintering please refer to FIG. 3 (B), as shown in FIG. 3 (B), the coating sintering forming thickness is between 60-80 μm and evenly distributed, and there are no serious open holes and peeling cracking defects. Further, as shown in FIGS. 3 (A) and (B), compared with Experiment A (comparative example), the particle construction of the green body in Experiment B (embodiment) is significantly improved, the densification degree of the green body is relatively increased, and interface defects of the substrate are significantly reduced.

The present disclosure fails to use the chemical vapor deposition technology (CVD) used in common commercially available products for preparation, in order to avoid that the relevant halogen doping (such as chlorine) content is too high, resulting in difficult electrical control of silicon carbide during growth, and because of high concentrations of halogen (such as chlorine) doping, it is easy to lead to the proliferation of new micropipe defects. The tantalum carbide coating of an embodiment of the present disclosure after high-temperature sintering is measured by glow discharge mass spectrometry (GDMS), and the test result is shown in Table 1.

Table 1 is doping amount of trace element of the coating of the present disclosure, and the trace element of the coating provided in Table 1 is an element that is more likely to affect electrical properties and quality when growing silicon carbide crystal ingots.

TABLE 1

Doping amount of trace element of the TaC coating of an embodiment of the present disclosure
TaC corrosion resistance coating

| Trace element | Concentration (ppm) |
|---|---|
| B | 0.07 |
| Al | 0.09 |
| Si | 0.26 |
| P | <0.05 |
| Cl | 0.22 |
| Ti | 0.02 |
| V | <0.01 |
| Cr | <0.5 |
| Fe | 0.18 |
| Ni | 0.09 |
| Cu | <0.05 |
| Zn | <0.1 |
| Ce | 0.17 |

As shown in Table 1, in a TaC coating formed by an embodiment of the present disclosure, the doping concentration of trace elements in the coating is low.

In summary, the present disclosure is characterized by the use of cold isostatic pressing densification and multiple constructing green body preparation method, effectively preparing carbide coating on the surface of graphite components at a lower sintering temperature (<2500° C.). The microstructure of the coating detected by SEM shows that the coating thickness is greater than 50 μm and evenly distributed on the surface of graphite components, and there are no serious open holes and peeling cracking defects. The present disclosure can be applied to the surfaces of the graphite crucible for crystal growth of compound semiconductor raw material and the graphite crucible of silicon carbide physical vapor phase crystal growth technology, thereby extending the service life of the crucible, reducing carbon impurity defects, and reducing skip plating grain boundary defects. The present disclosure can also be applied to the protective layer of graphite susceptor of the epitaxy process and the protective coating with high temperature corrosion resistance for the SiC-on-SiC epitaxy process. Based on the above, the present disclosure can enhance the domestic semiconductor related industry.

While the present invention has been described by means of specific embodiments, numerous modifications and variations could be made thereto by those skilled in the art without departing from the scope and spirit of the present invention set forth in the claims.

What is claimed is:

1. A method for preparing a carbide protective layer, steps comprising:
    (A) mixing a carbide powder, an organic binder, an organic solvent and a sintering aid to form a slurry;
    (B) spraying the slurry on a surface of a graphite component to form a composite component;
    (C) subjecting the composite component to a cold isostatic pressing densification process;
    (D) subjecting the composite component to a constant temperature heat treatment;
    (E) repeating steps (B)-(D) until a coating is formed on a surface of the composite component, and the coating has an effective protective thickness;
    (F) subjecting the coating to a segmented sintering process;
    (G) obtaining a carbide protective layer used for the surface of the composite component.

2. The method for preparing the carbide protective layer according to claim 1, wherein the carbide powder of step (A) is selected from a binary carbide of IIIB-VB transition metal elements.

3. The method for preparing the carbide protective layer according to claim 1, wherein the organic binder of step (A) is selected from polymethyl methacrylate (PMMA), polyvinyl alcohol (PVA), polyvinyl butyral (PVB) or polyvinylpyrrolidone (PVP).

4. The method for preparing the carbide protective layer according to claim 1, wherein the organic solvent of step (A) is selected from ethanol, isopropanol, acetone, butanone, formic acid, acetic acid, toluene or N-methylpyrrolidone.

5. The method for preparing the carbide protective layer according to claim 1, wherein the sintering aid of step (A) is selected from titanium, silicon, chromium, nickel, silicon nitride, yttrium oxide or ytterbium oxide.

6. The method for preparing the carbide protective layer according to claim 1, wherein an applying pressure of the cold isostatic pressing densification process of step (C) is 1000-20000 psi, time of the applying pressure is 1 hour or more.

7. The method for preparing the carbide protective layer according to claim 1, wherein a temperature of the constant temperature heat treatment of step (D) is 50-200° C.

8. The method for preparing the carbide protective layer according to claim 1, wherein the effective protective thickness of step (E) is 100 μm or more.

9. The method for preparing the carbide protective layer according to claim 1, wherein the segmented sintering process of step (F) is divided into: a previous stage of sintering, heat-treated at 250-500° C., a heating rate is 0.2-1° C./min, and a holding time is 1-3 hours; a post-stage sintering, sintered and densified at 1800-2300° C., a heating rate is 1-5° C./min, and a holding time is 0.5-5 hours.

* * * * *